(12) United States Patent
Zeng et al.

(10) Patent No.: US 10,192,931 B2
(45) Date of Patent: Jan. 29, 2019

(54) COMPLEMENTARY THIN FILM TRANSISTOR AND MANUFACTURING METHOD THEREOF

(71) Applicant: SHENZHEN CHINA STAR OPTOELECTRONICS TECHNOLOGY CO., LTD., Guangdong (CN)

(72) Inventors: Mian Zeng, Guangdong (CN); Hsiangchih Hsiao, Guangdong (CN); Shengdong Zhang, Guangdong (CN)

(73) Assignee: SHENZHEN CHINA STAR OPTOELECTRONICS TECHNOLOGY CO. LTD. (CN)

( * ) Notice: Subject to any disclaimer, the term of this patent is extended or adjusted under 35 U.S.C. 154(b) by 211 days.

(21) Appl. No.: 15/121,986

(22) PCT Filed: Apr. 8, 2016

(86) PCT No.: PCT/CN2016/078753
§ 371 (c)(1),
(2) Date: Aug. 26, 2016

(87) PCT Pub. No.: WO2017/147970
PCT Pub. Date: Sep. 8, 2017

(65) Prior Publication Data
US 2018/0166503 A1    Jun. 14, 2018

(30) Foreign Application Priority Data

Feb. 29, 2016 (CN) .......................... 2016 1 0113712

(51) Int. Cl.
*H01L 27/28* (2006.01)
*H01L 21/8238* (2006.01)
(Continued)

(52) U.S. Cl.
CPC ........ *H01L 27/286* (2013.01); *H01L 21/8238* (2013.01); *H01L 27/092* (2013.01);
(Continued)

(58) Field of Classification Search
None
See application file for complete search history.

(56) References Cited

U.S. PATENT DOCUMENTS

| 6,528,816 B1 | 3/2003 | Jackson |
| 2008/0080221 A1 | 4/2008 | Koo et al. |

(Continued)

FOREIGN PATENT DOCUMENTS

CN          1312958 A       9/2001

*Primary Examiner* — Michelle Mandala
(74) *Attorney, Agent, or Firm* — Emerson, Thomson & Bennett, LLC; Roger D. Emerson (57) ABSTRACT

A complementary thin film transistor and manufacturing method thereof are provided. The complementary thin film transistor has a substrate, an n-type semiconductor layer, a p-type semiconductor layer, and an etched barrier layer. The substrate defines an n-type transistor region and a p-type transistor region adjacent to the n-type transistor region. The n-type semiconductor layer is disposed on the substrate and within the n-type transistor region, and has a metal oxide material. The p-type semiconductor layer is disposed on the substrate and within the p-type transistor region, and has an organic semiconductor material. The etched barrier layer is formed on the n-type semiconductor layer and disposed within the n-type transistor region and the p-type transistor region, and the p-type semiconductor layer is formed on the etched barrier layer.

17 Claims, 5 Drawing Sheets

(51) Int. Cl.
*H01L 27/092* (2006.01)
*H01L 51/10* (2006.01)
H01L 29/786 (2006.01)
H01L 51/05 (2006.01)

(52) U.S. Cl.
CPC .......... *H01L 27/283* (2013.01); *H01L 51/107* (2013.01); *H01L 29/7869* (2013.01); *H01L 51/0541* (2013.01)

(56) References Cited

U.S. PATENT DOCUMENTS

2010/0148825 A1    6/2010   Park et al.
2012/0025320 A1*   2/2012   Chen .................. H01L 27/1225
                                                                    257/369

\* cited by examiner

COMPLEMENTARY THIN FILM TRANSISTOR AND MANUFACTURING METHOD THEREOF

FIELD OF THE INVENTION

The present invention relates to a thin film transistor and a manufacturing method thereof, and more particularly to a complementary thin film transistor and manufacturing method thereof.

BACKGROUND OF THE INVENTION

Complementary Metal-Oxide-Semiconductor (CMOS) which is a design of integrated circuit processes can make components of n-type MOSFET (NMOS) and p-type MOSFET (PMOS) from a silicon wafer template. CMOS means that physical characteristics of NMOS and PMOS are complementary. SRAM, microcontrollers, microprocessors, CMOS image sensing devices, or other digital logic circuitry can be made from a process of CMOS. CMOS is formed from NMOS and PMOS, and CMOS is a basic circuit construction of an integrated circuit.

Figure 1:
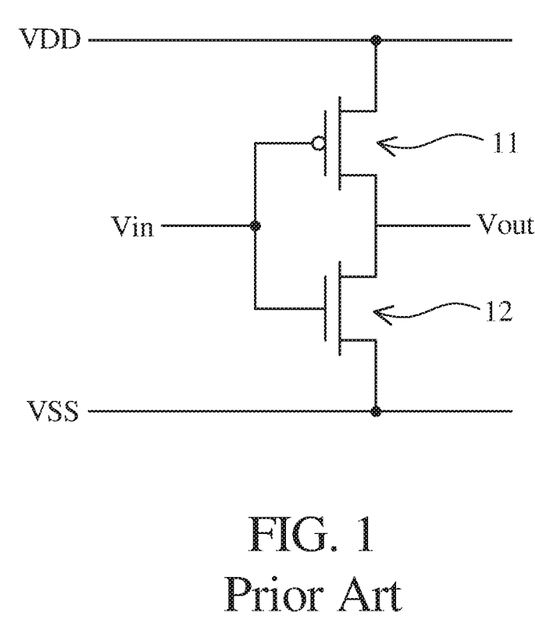
FIG. 1 is a schematic circuit diagram of a traditional inverter of a Continuous Time Fourier Transform.

A substrate of a display panel is a glass or plastic substrate. Refer to FIG. 1, which is a schematic circuit diagram of a traditional inverter of a Continuous Time Fourier Transform (CTFT). The CTFT connected to a power supply voltage VDD and a common voltage VSS has a p-type thin film transistor 11, and an n-type thin film transistor 12, wherein the n-type thin film transistor 12 is a active component formed on a substrate, and has a input end Vin and a output end Vout.

However, a drive chip and a glass substrate of the traditional liquid crystal display is not made by the design of an integrated separation. In the technology of low temperature poly-silicon (LTPS), the semiconductor of the p-type thin film transistor 11 and the n-type thin film transistor 12 in the CTFT circuit are made by different types of doping. The preparation process of the CTFT circuit has a complex process of laser annealing and ion implantation with a high manufacturing cost.

SUMMARY OF THE INVENTION

An object of the present invention is to provide a complementary thin film transistor, wherein an n-type thin film transistor is formed within the n-type transistor region and a p-type thin film transistor is formed within the p-type transistor region and an electrode metal layer is covered on an etched barrier layer to ensure a smooth surface of a channel in a p-type semiconductor layer.

Another object of the present invention is to provide a manufacturing method of a complementary thin film transistor, wherein an n-type thin film transistor is formed within the n-type transistor region and a p-type thin film transistor is formed within the p-type transistor region to improve the device characteristics.

To achieve the above object, the present invention provides a complementary thin film transistor, the complementary thin film transistor comprises a substrate, an n-type semiconductor layer, a p-type semiconductor layer, and an etched barrier layer. The substrate is defined by an n-type transistor region and a p-type transistor region adjacent to the n-type transistor region. The n-type semiconductor layer is disposed on the substrate and within the n-type transistor region, wherein the n-type semiconductor layer comprises a metal oxide material, and the metal oxide material of the n-type semiconductor layer is selected from indium gallium zinc oxide, indium zinc oxide, or zinc tin oxide. The p-type semiconductor layer is disposed on the substrate and within the p-type transistor region, wherein the p-type semiconductor layer comprises organic semiconductor material. The etched barrier layer is formed on the n-type semiconductor layer and disposed within the n-type transistor region and the p-type transistor region, wherein the p-type semiconductor layer is formed on the etched barrier layer and the organic semiconductor material of the p-type semiconductor layer is selected from pentacene, triphenylamine, fullerene, phthalocyanine, perylene derivative, or cyanine.

In one embodiment of the present invention, the complementary thin film transistor further includes a first gate layer and an insulation layer, the first gate layer is formed on the substrate and disposed within the n-type transistor region, the insulation layer is formed on the first gate layer and the substrate and disposed within the n-type transistor region and the p-type transistor region, wherein the n-type semiconductor layer and the etched barrier layer are formed on the insulation layer.

In one embodiment of the present invention, the complementary thin film transistor further includes an electrode metal layer disposed within the n-type transistor region and the p-type transistor region, wherein the electrode metal layer is formed on the n-type semiconductor layer, and the p-type semiconductor layer is formed on the electrode metal layer.

In one embodiment of the present invention, the complementary thin film transistor further includes a passivation layer and a second gate layer, the passivation layer is formed on the electrode metal layer and disposed within the n-type transistor region and the p-type transistor region, and the second gate layer is formed on the passivation layer and disposed within the p-type transistor region.

In one embodiment of the present invention, the complementary thin film transistor further includes a buffer layer formed on the whole etched barrier layer and disposed within the n-type transistor region and the p-type transistor region.

In one embodiment of the present invention, the metal oxide material of the n-type semiconductor layer is selected from indium gallium zinc oxide, indium zinc oxide, or zinc tin oxide.

In one embodiment of the present invention, the organic semiconductor material of the p-type semiconductor layer is selected from pentacene, triphenylamine, fullerene, phthalocyanine, perylene derivative, or cyanine.

To achieve the above object, the present invention provides a manufacturing method of a complementary thin film transistor, the method comprises steps of: a first gate layer formation step for defining an n-type transistor region and a p-type transistor region adjacent to the n-type transistor region on a substrate, and forming a first gate layer on the substrate, wherein the first gate layer is disposed within the n-type transistor region; an insulation layer formation step for forming an insulation layer on the first gate layer and the substrate, wherein the insulation layer is disposed within the n-type transistor region and the p-type transistor region; an n-type semiconductor layer formation step for forming an n-type semiconductor layer on the insulation layer, wherein the n-type semiconductor layer is disposed within the n-type transistor region and comprises a metal oxide material; an etched barrier layer formation step for forming an etched barrier layer on the n-type semiconductor layer and the insulation layer, wherein the etched barrier layer is disposed within the n-type transistor region and the p-type transistor region; an electrode metal layer formation step for forming an electrode metal layer on the n-type transistor region, wherein the electrode metal layer is disposed within the n-type transistor region and the p-type transistor region; and a p-type semiconductor layer formation step for forming a p-type semiconductor layer on the electrode metal layer, wherein the p-type semiconductor layer is disposed within the p-type transistor region and comprises an organic semiconductor material.

In one embodiment of the present invention, after the etched barrier layer formation step, the manufacturing method further comprises a passivation layer formation step for forming a passivation layer on the whole etched barrier layer, and the passivation layer formation is disposed within the n-type transistor region and the p-type transistor region.

In one embodiment of the present invention, after the p-type semiconductor layer formation step, the manufacturing method further comprises a second gate layer formation step for forming a passivation layer on the electrode metal layer disposed within the n-type transistor region and the p-type transistor region, and forming a second gate layer on the passivation layer disposed within the p-type transistor region.

As described above, in the complementary thin film transistor of the present invention, an n-type thin film transistor is formed within the n-type transistor region and a p-type thin film transistor is formed within the p-type transistor region, and the electrode metal layer is covered on an etched barrier layer to ensure a smooth surface of a channel in a p-type semiconductor layer, so that device characteristics can be improved.

DETAILED DESCRIPTION OF THE PREFERRED EMBODIMENTS

The structure and the technical means adopted by the present invention to achieve the above and other objects can be best understood by referring to the following detailed description of the preferred embodiments and the accompanying drawings. Furthermore, directional terms described by the present invention, such as upper, lower, front, back, left, right, inner, outer, side, longitudinal/vertical, transverse/horizontal, and etc., are only directions by referring to the accompanying drawings, and thus the used directional terms are used to describe and understand the present invention, but the present invention is not limited thereto.

Figure 2:
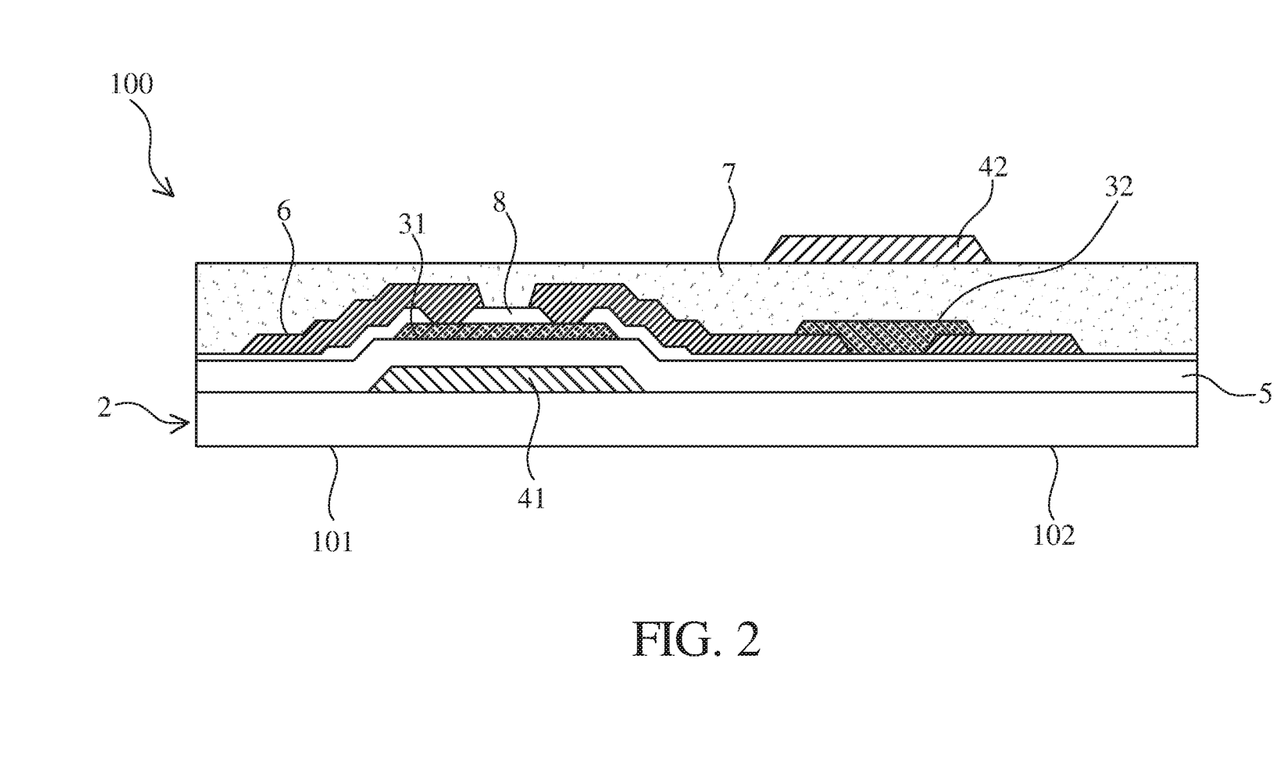
FIG. 2 is a cross-sectional view of a complementary thin film transistor according to a first preferred embodiment of the present invention.

Refer to FIG. 2, which is a cross-sectional view of a complementary thin film transistor 100 according to a first preferred embodiment of the present invention, wherein the complementary thin film transistor 100 has a substrate 2, an n-type semiconductor layer 31, a p-type semiconductor layer 32, a first gate layer 41, a insulation layer 5, an electrode metal layer 6, a passivation layer 7, a second gate layer 42, and an etched barrier layer 8. The detailed structure of each component, assembly relationships, and principle of operation in the present invention will be described in detail hereinafter.

Refer still to FIG. 2, the substrate 2 defines an n-type transistor region 101 and a p-type transistor region 102 adjacent to the n-type transistor region 101, wherein the substrate 2 is a glass substrate in the first preferred embodiment, and the substrate 2 is also a polyethylene terephthalate substrate in another preferred embodiment.

Refer to FIG. 2, the n-type semiconductor layer 31 is disposed above the substrate 2 and within the n-type transistor region 101, wherein the n-type semiconductor layer 31 comprises a metal oxide material, and the metal oxide material of the n-type semiconductor layer 31 is selected from an indium gallium zinc oxide, an indium zinc oxide, or a zinc tin oxide in the first preferred embodiment.

Refer still to FIG. 2, the p-type semiconductor layer 32 is disposed above the substrate 2 and within the p-type transistor region 102, wherein the p-type semiconductor layer 32 comprises an organic semiconductor material, and the organic semiconductor material of the p-type semiconductor layer 32 is selected from pentacene, triphenylamine, fullerene, phthalocyanine, perylene derivative, or cyanine in the first preferred embodiment.

Refer still to FIG. 2, the first gate layer 41 is formed on the substrate 2, and disposed within the n-type transistor region 101. The first gate layer 41 is a metal material, such as aluminum, manganese, copper, titanium, or an alloy thereof in the first preferred embodiment.

Refer still to FIG. 2, the insulation layer 5 is formed on the first gate layer 41 and the substrate 2 and disposed within the n-type transistor region 101 and the p-type transistor region 102, wherein the n-type semiconductor layer 31 is formed on the insulation layer 5 and aligned to the first gate layer 41, and the etched barrier layer 8 is formed on the whole insulation layer 5. The insulation layer 5 is an inorganic insulating material, such as SiNx or SiOx, and formed for insulating from the first gate layer 41 in the first preferred embodiment.

Refer still to FIG. 2, the electrode metal layer 6 is formed on the etched barrier layer 8 and disposed within the n-type transistor region 101 and the p-type transistor region 102, and the electrode metal layer 6 is disposed by sputtering a layer of a metal material (such as Mo/Al/Mo, Cu/Ti, and Au) on the etched barrier layer 8, and then the metal material is exposed, developed, etched, and stripped to form the electrode metal layer 6. Wherein the electrode metal layer 6 is connected to the n-type semiconductor layer 31 through at least one through hole of the etched barrier layer 8, and the p-type semiconductor layer 32 is formed on the electrode metal layer 6.

Refer still to FIG. 2, the passivation layer 7 is formed on the electrode metal layer 6 and the etched barrier layer 8 and disposed within the n-type transistor region 101 and the p-type transistor region 102, wherein the passivation layer 7 is formed for insulating from the second gate layer 42 in the first preferred embodiment.

Refer still to FIG. 2, the second gate layer 42 is formed on the passivation layer 7 and disposed within the p-type transistor region 102.

According to a structure of the present invention, the n-type thin film transistor is formed within the n-type transistor region 101 and the p-type thin film transistor is formed within the p-type transistor region 102 through disposing the n-type semiconductor layer 31 and the p-type semiconductor layer 32 above the substrate 2, so that the organic TFT can be made to be the area structure of the p-type thin film transistor (the p-type semiconductor layer 32 is disposed by the organic TFT), and the oxide TFT can be made to be the area structure of the n-type thin film transistor (the n-type semiconductor layer 31 is disposed by the oxide TFT). Therefore a smooth surface of a channel in the p-type semiconductor layer 32 can be ensured, and the device characteristics can be improved, such as increasing an on-state current (Ion), reducing off-state current (Ioff), and improving the shift of voltage Vth without additional cost.

As described above, in the complementary thin film transistor 100 of the present invention, the n-type thin film transistor is formed within the n-type transistor region 101 and the p-type thin film transistor is formed within the p-type transistor region 102, and the electrode metal layer 6 is covered on the etched barrier layer 8 to ensure the smooth surface of a channel in a p-type semiconductor layer 32, so that device characteristics can be improved.

Figure 3:
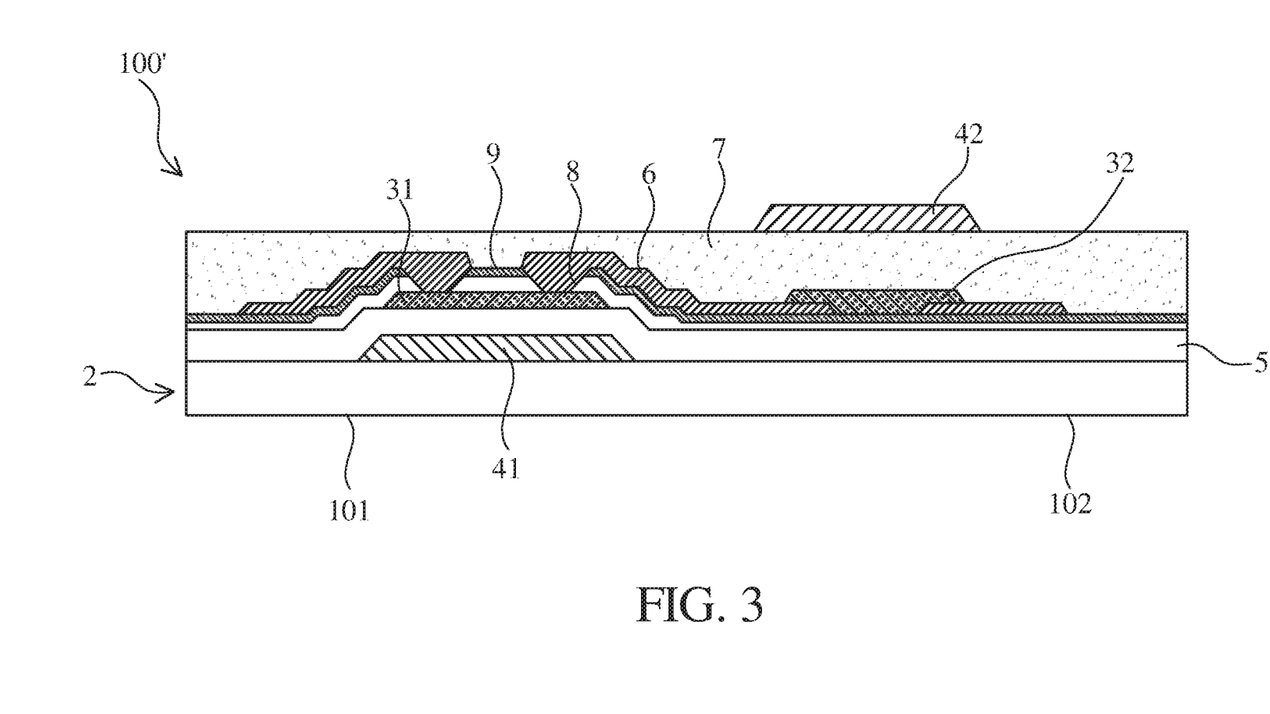
FIG. 3 is a cross-sectional view of a complementary thin film transistor according to a second preferred embodiment of the present invention.

Refer to FIG. 3, which is a cross-sectional view of a complementary thin film transistor 100' according to a second preferred embodiment of the present invention, and is similar to the first preferred embodiment, wherein the complementary thin film transistor 100' has a substrate 2, an n-type semiconductor layer 31, a p-type semiconductor layer 32, a first gate layer 41, a insulation layer 5, an electrode metal layer 6, a passivation layer 7, a second gate layer 42, and an etched barrier layer 8. As shown, the difference of the second preferred embodiment is that the complementary thin film transistor 100' further includes a buffer layer 9 formed on the whole etched barrier layer 8 and disposed within the n-type transistor region 101 and the p-type transistor region 102, wherein the buffer layer 9 is an organic material.

As described above, the complementary thin film transistor 100' can ensure the smooth surface of a channel in a p-type semiconductor layer 32, so that device characteristics can be improved. In addition, the inorganic insulating material of the etched barrier layer 8 and the organic semiconductor material of the p-type semiconductor layer 32 cannot be matched. The organic material of the buffer layer 9 is formed on the etched barrier layer 8, so that the problems that the organic material is unstable and affected by the environment easily can overcome to optimize the structure of the complementary thin film transistor 100'.

Figure 4:
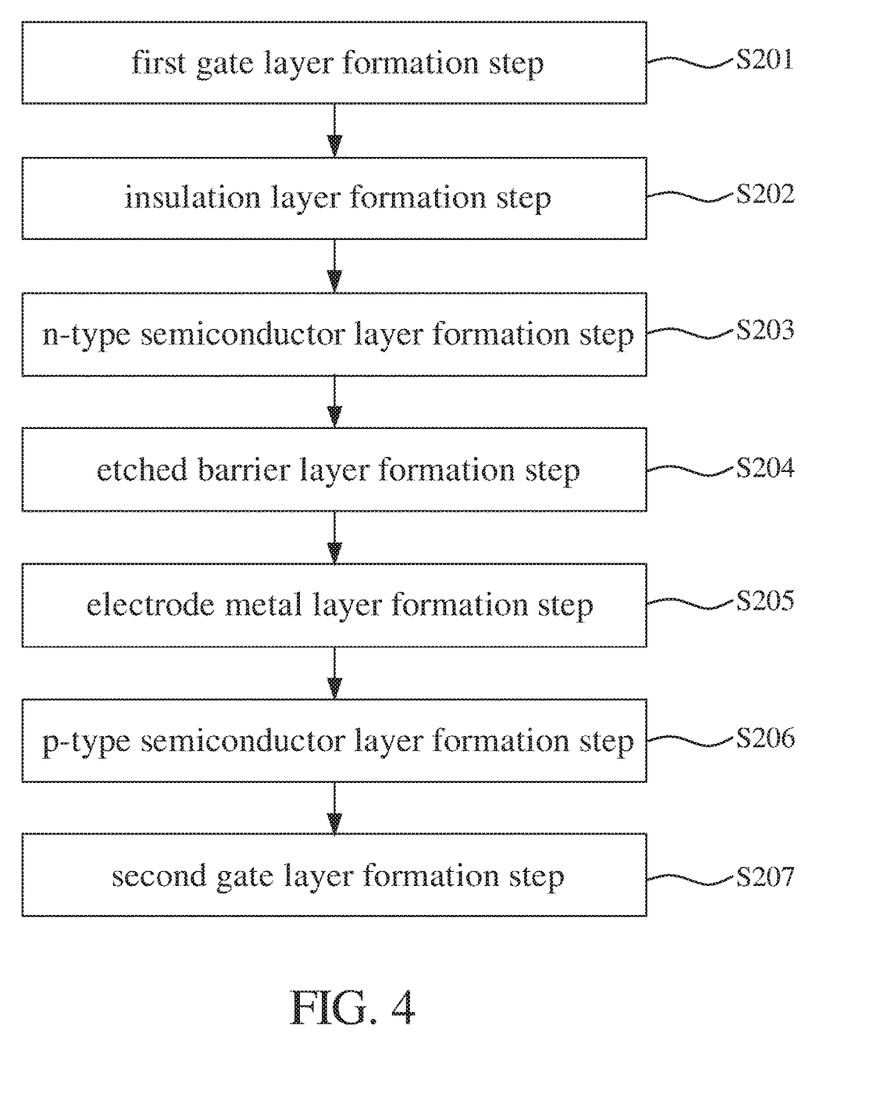
FIG. 4 is a flowchart of a manufacturing method of a complementary thin film transistor according to the first preferred embodiment of the present invention.

Refer to FIG. 4 with reference FIG. 2, which is a flowchart of a manufacturing method of a complementary thin film transistor according to the first preferred embodiment of the present invention is illustrated. As shown, the measuring method comprises a first gate layer formation step S201, an insulation layer formation step S202, an n-type semiconductor layer formation step S203, an etched barrier layer formation step S204, an electrode metal layer formation step S205, a p-type semiconductor layer formation step S206, and a second gate layer formation step S207.

Refer still to FIG. 4 with reference FIG. 2, in the first gate layer formation step S201, a substrate 2 is defined by an n-type transistor region 101 and a p-type transistor region 102 adjacent to the n-type transistor region 101, and a first gate layer 41 is formed on the substrate 2, and disposed within the n-type transistor region 101.

Refer still to FIG. 4 with reference FIG. 2, in the insulation layer formation step S202, an insulation layer 5 is formed on the first gate layer 41 and the substrate 2, and disposed within the n-type transistor region 101.

Refer still to FIG. 4 with reference FIG. 2, in the n-type semiconductor layer formation step S203, an n-type semiconductor layer 31 is formed on the insulation layer 5 within the n-type transistor region 101, wherein the n-type semiconductor layer 31 comprises a metal oxide material.

Refer still to FIG. 4 with reference FIG. 2, in the etched barrier layer formation step S204, an etched barrier layer 8 is formed on the n-type semiconductor layer 31 and the insulation layer 5, wherein the etched barrier layer 8 is disposed within the n-type transistor region 101 and the p-type transistor region 102.

Refer still to FIG. 4 with reference FIG. 2, in the electrode metal layer formation step S205, an electrode metal layer 6 is formed on the n-type semiconductor layer 31 and the etched barrier layer 8, and disposed within the n-type transistor region 101 and the p-type transistor region 102.

Refer still to FIG. 4 with reference FIG. 2, in the p-type semiconductor layer formation step S206, a p-type semiconductor layer 32 is formed on the electrode metal layer 6, and disposed within the p-type transistor region 102, wherein the p-type semiconductor layer 32 comprises an organic semiconductor material.

Refer still to FIG. 4 with reference FIG. 2, in the second gate layer formation step S207, a passivation layer 7 is formed on the electrode metal layer 6, and disposed within the n-type transistor region 101 and the p-type transistor region 102, and then a second gate layer 42 is formed on the passivation layer 7, and disposed within the p-type transistor region 102.

As described above, in the complementary thin film transistor 100 of the present invention, the n-type thin film transistor is formed within the n-type transistor region 101 and the p-type thin film transistor is formed within the p-type transistor region 102, and the electrode metal layer 6 is covered on the etched barrier layer 8 to ensure the smooth surface of a channel in a p-type semiconductor layer 32, so that device characteristics can be improved.

Figure 5:
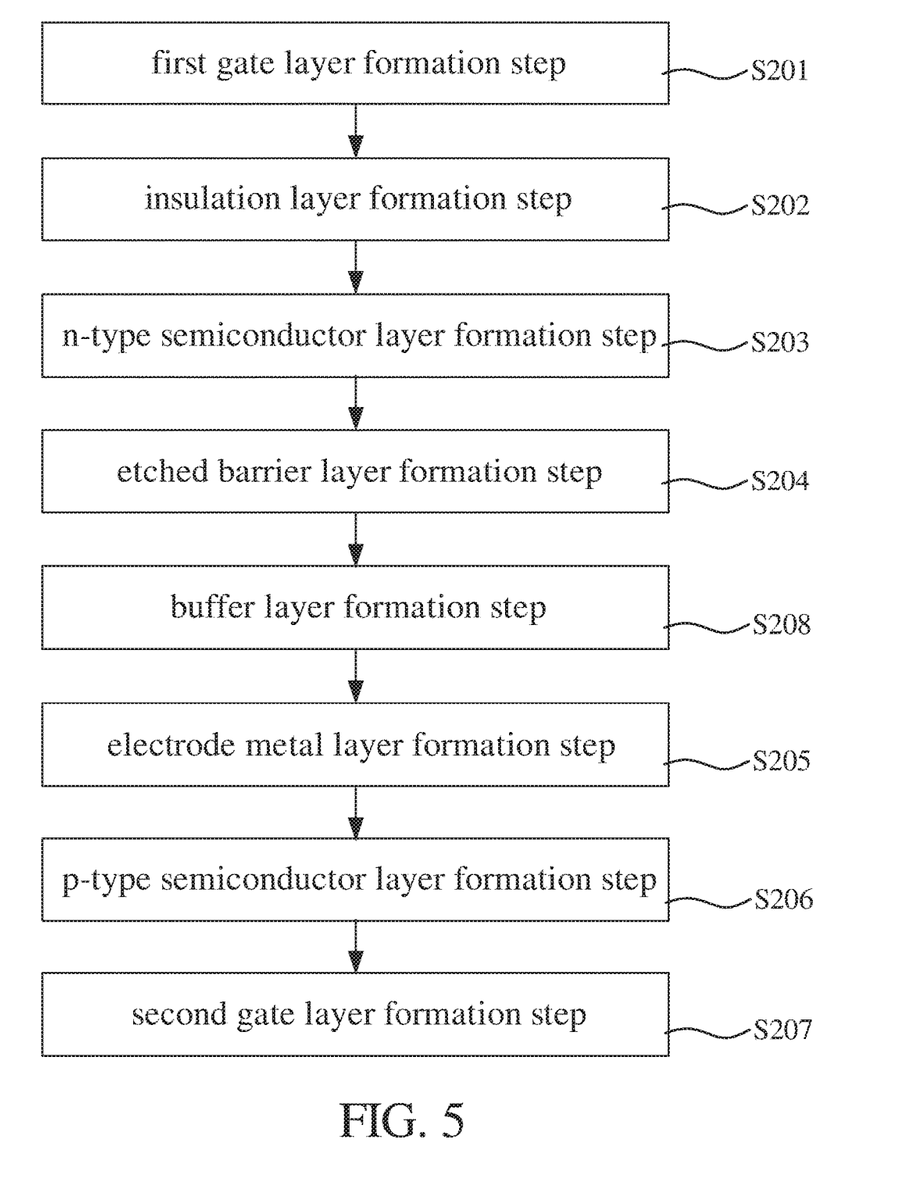
FIG. 5 is a flowchart of a manufacturing method of a complementary thin film transistor according to the second preferred embodiment of the present invention.

Refer to FIG. 5 with reference FIG. 3, which is a flowchart of a manufacturing method of a complementary thin film transistor according to the second preferred embodiment of the present invention. As shown, the measuring method comprises a first gate layer formation step S201, an insulation layer formation step S202, an n-type semiconductor layer formation step S203, an etched barrier layer formation step S204, a buffer layer formation step S208, an electrode metal layer formation step S205, a p-type semiconductor layer formation step S206, and a second gate layer formation step S207.

Refer still to FIG. 5 with reference FIG. 3, in the first gate layer formation step S201, a substrate 2 is defined by an n-type transistor region 101 and a p-type transistor region 102 adjacent to the n-type transistor region 101, and a first gate layer 41 is formed on the substrate 2, and disposed within the n-type transistor region 101.

Refer still to FIG. 5 with reference FIG. 3, in the insulation layer formation step S202, an insulation layer 5 is formed on the first gate layer 41 and the substrate 2, and disposed within the n-type transistor region 101.

Refer still to FIG. 5 with reference FIG. 3, in the n-type semiconductor layer formation step S203, an n-type semiconductor layer 31 is formed on the insulation layer 5 within the n-type transistor region 101, wherein the n-type semiconductor layer 31 comprises a metal oxide material.

Refer still to FIG. 5 with reference FIG. 3, in the etched barrier layer formation step S204, an etched barrier layer 8 is formed on the n-type semiconductor layer 31 and the insulation layer 5, wherein the etched barrier layer 8 is disposed within the n-type transistor region 101 and the p-type transistor region 102.

Refer still to FIG. 5 with reference FIG. 3, in the buffer layer formation step S208, a buffer layer 9 is formed on the whole etched barrier layer 8 and disposed within the n-type transistor region 101 and the p-type transistor region 102.

Refer still to FIG. 5 with reference FIG. 3, in the electrode metal layer formation step S205, an electrode metal layer 6 is formed on the n-type semiconductor layer 31 and the etched barrier layer 8, and disposed within the n-type transistor region 101 and the p-type transistor region 102.

Refer still to FIG. 5 with reference FIG. 3, in the p-type semiconductor layer formation step S206, a p-type semiconductor layer 32 is formed on the electrode metal layer 6, and disposed within the p-type transistor region 102, wherein the p-type semiconductor layer 32 comprises an organic semiconductor material.

Refer still to FIG. 5 with reference FIG. 3, in the second gate layer formation step S207, a passivation layer 7 is formed on the electrode metal layer 6, and disposed within the n-type transistor region 101 and the p-type transistor region 102, and then a second gate layer 42 is formed on the passivation layer 7, and disposed within the p-type transistor region 102.

As described above, the complementary thin film transistor 100' can ensure the smooth surface of a channel in a p-type semiconductor layer 32, so that device characteristics can be improved. In addition, the inorganic insulating material of the etched barrier layer 8 and the organic semiconductor material of the p-type semiconductor layer 32 cannot be matched. The organic material of the buffer layer 9 is formed on the etched barrier layer 8, so that the problems that the organic material is unstable and affected by the environment easily can overcome to optimize the structure of the complementary thin film transistor 100'.

The present invention has been described with preferred embodiments thereof and it is understood that many changes and modifications to the described embodiments can be carried out without departing from the scope and the spirit of the invention that is intended to be limited only by the appended claims.

What is claimed is:

1. A complementary thin film transistor, comprising:
a substrate defined by an n-type transistor region and a p-type transistor region adjacent to the n-type transistor region;
an n-type semiconductor layer disposed on the substrate and within the n-type transistor region, wherein the n-type semiconductor layer comprises a metal oxide material, and the metal oxide material of the n-type semiconductor layer is selected from indium gallium zinc oxide, indium zinc oxide or zinc tin oxide;
a p-type semiconductor layer disposed on the substrate and within the p-type transistor region, wherein the p-type semiconductor layer comprises organic semiconductor material; and
an etched barrier layer formed on the n-type semiconductor layer and disposed within the n-type transistor region and the p-type transistor region, wherein the p-type semiconductor layer is formed on the etched barrier layer and the organic semiconductor material of the p-type semiconductor layer is selected from pentacene, triphenylamine, fullerene, phthalocyanine, perylene derivative, or cyanine; and a buffer layer formed on the whole etched barrier layer and disposed within the n-type transistor region and the p-type transistor region.

2. The complementary thin film transistor according to claim 1, wherein the complementary thin film transistor further includes a first gate layer and an insulation layer, the first gate layer is formed directly on the substrate and disposed within the n-type transistor region, the insulation layer is formed on the first gate layer and the substrate and disposed within the n-type transistor region and the p-type transistor region, wherein the n-type semiconductor layer and the etched barrier layer are formed on the insulation layer.

3. The complementary thin film transistor according to claim 2, wherein the complementary thin film transistor further includes an electrode metal layer disposed within the n-type transistor region and the p-type transistor region, wherein the electrode metal layer is formed on the n-type semiconductor layer, and the p-type semiconductor layer is formed on the electrode metal layer.

4. The complementary thin film transistor according to claim 2, wherein the complementary thin film transistor further includes a passivation layer and a second gate layer, the passivation layer is formed on the electrode metal layer and disposed within the n-type transistor region and the p-type transistor region, and the second gate layer is formed on the passivation layer and disposed within the p-type transistor region.

5. The complementary thin film transistor according to claim 1, wherein the complementary thin film transistor further includes an electrode metal layer disposed within the n-type transistor region and the p-type transistor region, wherein the electrode metal layer is formed on the n-type semiconductor layer, and the p-type semiconductor layer is formed on the electrode metal layer.

6. The complementary thin film transistor according to claim 1, wherein the complementary thin film transistor further includes a passivation layer and a second gate layer, the passivation layer is formed on the electrode metal layer and disposed within the n-type transistor region and the p-type transistor region, and the second gate layer is formed on the passivation layer and disposed within the p-type transistor region.

7. A complementary thin film transistor, comprising:
a substrate defined by an n-type transistor region and a p-type transistor region adjacent to the n-type transistor region;
an n-type semiconductor layer disposed on the substrate and within the n-type transistor region, wherein the n-type semiconductor layer comprises a metal oxide material;
a p-type semiconductor layer disposed on the substrate and within the p-type transistor region, wherein the p-type semiconductor layer comprises an organic semiconductor material; and
an etched barrier layer formed on the n-type semiconductor layer and disposed within the n-type transistor region and the p-type transistor region, wherein the p-type semiconductor layer is formed on the etched barrier layer; and
a buffer layer formed on the whole etched barrier layer and disposed within the n-type transistor region and the p-type transistor region.

8. The complementary thin film transistor according to claim 7, wherein the complementary thin film transistor further includes a first gate layer and an insulation layer, the first gate layer is formed directly on the substrate and disposed within the n-type transistor region, the insulation layer is formed on the first gate layer and the substrate and disposed within the n-type transistor region and the p-type transistor region, wherein the n-type semiconductor layer and the etched barrier layer are formed on the insulation layer.

9. The complementary thin film transistor according to claim 8, wherein the complementary thin film transistor further includes an electrode metal layer disposed within the n-type transistor region and the p-type transistor region, wherein the electrode metal layer is formed on the n-type semiconductor layer, and the p-type semiconductor layer is formed on the electrode metal layer.

10. The complementary thin film transistor according to claim 8, wherein the complementary thin film transistor further includes a passivation layer and a second gate layer, the passivation layer is formed on the electrode metal layer and disposed within the n-type transistor region and the p-type transistor region, and the second gate layer is formed on the passivation layer and disposed within the p-type transistor region.

11. The complementary thin film transistor according to claim 7, wherein the complementary thin film transistor further includes an electrode metal layer disposed within the n-type transistor region and the p-type transistor region, wherein the electrode metal layer is formed on the n-type semiconductor layer, and the p-type semiconductor layer is formed on the electrode metal layer.

12. The complementary thin film transistor according to claim 7, wherein the complementary thin film transistor further includes a passivation layer and a second gate layer, the passivation layer is formed on the electrode metal layer and disposed within the n-type transistor region and the p-type transistor region, the second gate layer is formed on the passivation layer and disposed within the p-type transistor region.

13. The complementary thin film transistor according to claim 7, wherein the metal oxide material of the n-type semiconductor layer is selected from indium gallium zinc oxide, indium zinc oxide, or zinc tin oxide.

14. The complementary thin film transistor according to claim 7, wherein the organic semiconductor material of the p-type semiconductor layer is selected from pentacene, triphenylamine, fullerene, phthalocyanine, perylene derivative, or cyanine.

15. A manufacturing method of a complementary thin film transistor, comprising steps of:
  a first gate layer formation step for defining an n-type transistor region and a p-type transistor region adjacent to the n-type transistor region on a substrate, and forming a first gate layer directly on the substrate, wherein the first gate layer is disposed within the n-type transistor region;
  an insulation layer formation step for forming an insulation layer on the first gate layer and the substrate, wherein the insulation layer is disposed within the n-type transistor region and the p-type transistor region;
  an n-type semiconductor layer formation step for forming an n-type semiconductor layer on the insulation layer, wherein the n-type semiconductor layer is disposed within the n-type transistor region and comprises a metal oxide material;
  an etched barrier layer formation step for forming an etched barrier layer on the n-type semiconductor layer and the insulation layer, wherein the etched barrier layer is disposed within the n-type transistor region and the p-type transistor region;
  a buffer layer formation step for forming a buffer layer on the whole etched barrier layer, and the buffer layer is disposed within the n-type transistor region and the p-type transistor region;
  an electrode metal layer formation step for forming an electrode metal layer on the n-type transistor region, wherein the electrode metal layer is disposed within the n-type transistor region and the p-type transistor region; and
  a p-type semiconductor layer formation step for forming a p-type semiconductor layer on the electrode metal layer, wherein the p-type semiconductor layer is disposed within the p-type transistor region and comprises an organic semiconductor material.

16. The manufacturing method according to claim 15, wherein after the etched barrier layer formation step, the manufacturing method further comprises a passivation layer formation step for forming a passivation layer on the whole etched barrier layer, and the passivation layer formation is disposed within the n-type transistor region and the p-type transistor region.

17. The manufacturing method according to claim 15, wherein after the p-type semiconductor layer formation step, the manufacturing method further comprises a second gate layer formation step for forming a passivation layer on the electrode metal layer disposed within the n-type transistor region and the p-type transistor region, and forming a second gate layer on the passivation layer disposed within the p-type transistor region.

* * * * *